(12) United States Patent
Jeon et al.

(10) Patent No.: US 9,184,148 B2
(45) Date of Patent: Nov. 10, 2015

(54) SEMICONDUCTOR PACKAGE AND METHOD THEREFOR

(71) Applicant: Amkor Technology, Inc., Chandler, AZ (US)

(72) Inventors: Hyung Il Jeon, Gyeonggi-do (KR); Ji Young Chung, Gyeonggi-do (KR); Byong Jin Kim, Gyeonggi-do (KR); In Bae Park, Seoul (KR); Jae Min Bae, Seoul (KR); No Sun Park, Gyeonggi-do (KR)

(73) Assignee: Amkor Technology, Inc., Tempe, AZ (US)

( * ) Notice: Subject to any disclaimer, the term of this patent is extended or adjusted under 35 U.S.C. 154(b) by 0 days.

(21) Appl. No.: 14/521,417

(22) Filed: Oct. 22, 2014

(65) Prior Publication Data

US 2015/0115422 A1    Apr. 30, 2015

(30) Foreign Application Priority Data

Oct. 24, 2013    (KR) .................. 10-2013-0126885

(51) Int. Cl.
*H01L 23/00* (2006.01)
*H01L 23/495* (2006.01)

(52) U.S. Cl.
CPC .......... *H01L 24/17* (2013.01); *H01L 23/49541* (2013.01); *H01L 23/49548* (2013.01); *H01L 23/49572* (2013.01); *H01L 24/81* (2013.01)

(58) Field of Classification Search
CPC ........ H01L 23/495; H01L 24/17; H01L 24/81
See application file for complete search history.

(56) References Cited

U.S. PATENT DOCUMENTS

| 2,596,993 A | 5/1952 | Gookin |
| 3,435,815 A | 4/1969 | Forcier |
| 3,734,660 A | 5/1973 | Davies et al. |
| 3,838,984 A | 10/1974 | Crane et al. |
| 4,054,238 A | 10/1977 | Lloyd et al. |
| 4,189,342 A | 2/1980 | Kock |
| 4,221,925 A | 9/1980 | Finley et al. |
| 4,258,381 A | 3/1981 | Inaba et al. |

(Continued)

FOREIGN PATENT DOCUMENTS

| DE | 19734794 A1 | 8/1997 |
| EP | 0393997 | 10/1990 |

(Continued)

OTHER PUBLICATIONS

Office Action received from Korean Patent Office in Korean; English Translation Not Available; Date: Jan. 20, 2015; 4 pages.
National Semiconductor Corporation, "Leadless Leadframe Package," Informational Pamphlet from webpage, 21 pages, Oct. 2002, www.national.com.

(Continued)

*Primary Examiner* — Roy Potter
(74) *Attorney, Agent, or Firm* — Kevin B. Jackson

(57) ABSTRACT

In one embodiment, an electronic package structure includes a lead having a first width. An electronic chip having a conductive bump on a major surface, the conductive bump has a second width greater than the first width. The conductive bump is attached to the lead such that a portion of the conductive bump extends to at least partially surround a side surface of the lead. A molding compound resin encapsulates the electronic chip, the conductive bump, and at least a portion of the lead. The lead is configured so strengthen the joining force between the lead and conductive bump.

20 Claims, 4 Drawing Sheets

(56) References Cited

U.S. PATENT DOCUMENTS

| | | |
|---|---|---|
| 4,289,922 A | 9/1981 | Devlin |
| 4,301,464 A | 11/1981 | Otsuki et al. |
| 4,332,537 A | 6/1982 | Slepcevic |
| 4,417,266 A | 11/1983 | Grabbe et al. |
| 4,451,224 A | 5/1984 | Harding et al. |
| 4,530,152 A | 7/1985 | Roche et al. |
| 4,541,003 A | 9/1985 | Otsuka et al. |
| 4,646,710 A | 3/1987 | Schmid et al. |
| 4,707,724 A | 11/1987 | Suzuki et al. |
| 4,727,633 A | 3/1988 | Herrick et al. |
| 4,737,839 A | 4/1988 | Burt et al. |
| 4,756,080 A | 7/1988 | Thorp et al. |
| 4,812,896 A | 3/1989 | Rothgery et al. |
| 4,862,245 A | 8/1989 | Pashby et al. |
| 4,862,246 A | 8/1989 | Masuda et al. |
| 4,907,067 A | 3/1990 | Derryberry et al. |
| 4,920,074 A | 4/1990 | Shimizu et al. |
| 4,935,803 A | 6/1990 | Kalfus et al. |
| 4,942,454 A | 7/1990 | Mori et al. |
| 4,987,475 A | 1/1991 | Schlesinger et al. |
| 5,018,003 A | 5/1991 | Yasunaga et al. |
| 5,029,386 A | 7/1991 | Chao et al. |
| 5,041,902 A | 8/1991 | McShane et al. |
| 5,057,900 A | 10/1991 | Yamazaki et al. |
| 5,059,379 A | 10/1991 | Tsutsumi et al. |
| 5,065,223 A | 11/1991 | Matsuki et al. |
| 5,070,039 A | 12/1991 | Johnson et al. |
| 5,087,961 A | 2/1992 | Long et al. |
| 5,091,341 A | 2/1992 | Asada et al. |
| 5,096,852 A | 3/1992 | Hobson et al. |
| 5,118,298 A | 6/1992 | Murphy |
| 5,122,860 A | 6/1992 | Kikuchi et al. |
| 5,134,773 A | 8/1992 | LeMaire et al. |
| 5,151,039 A | 9/1992 | Murphy |
| 5,157,475 A | 10/1992 | Yamaguchi et al. |
| 5,157,480 A | 10/1992 | McShane et al. |
| 5,168,368 A | 12/1992 | Gow et al. |
| 5,172,213 A | 12/1992 | Zimmerman et al. |
| 5,172,214 A | 12/1992 | Casto et al. |
| 5,175,060 A | 12/1992 | Enomoto et al. |
| 5,200,362 A | 4/1993 | Lin et al. |
| 5,200,809 A | 4/1993 | Kwon et al. |
| 5,214,845 A | 6/1993 | King et al. |
| 5,216,278 A | 6/1993 | Lin et al. |
| 5,218,231 A | 6/1993 | Kudo et al. |
| 5,221,642 A | 6/1993 | Burns et al. |
| 5,250,841 A | 10/1993 | Sloan et al. |
| 5,252,853 A | 10/1993 | Michii et al. |
| 5,258,094 A | 11/1993 | Furui et al. |
| 5,266,834 A | 11/1993 | Nishi et al. |
| 5,273,938 A | 12/1993 | Lin et al. |
| 5,277,972 A | 1/1994 | Sakumoto et al. |
| 5,278,446 A | 1/1994 | Nagaraj et al. |
| 5,279,029 A | 1/1994 | Burns et al. |
| 5,281,849 A | 1/1994 | Singh Deo et al. |
| 5,285,352 A | 2/1994 | Pastore et al. |
| 5,294,897 A | 3/1994 | Notani et al. |
| 5,327,008 A | 7/1994 | Djennas et al. |
| 5,332,864 A | 7/1994 | Liang et al. |
| 5,335,771 A | 8/1994 | Murphy et al. |
| 5,336,931 A | 8/1994 | Juskey et al. |
| 5,343,076 A | 8/1994 | Katayama et al. |
| 5,358,905 A | 10/1994 | Chiu et al. |
| 5,365,106 A | 11/1994 | Watanabe et al. |
| 5,381,042 A | 1/1995 | Lerner et al. |
| 5,391,439 A | 2/1995 | Tomita et al. |
| 5,406,124 A | 4/1995 | Morita et al. |
| 5,410,180 A | 4/1995 | Fujii et al. |
| 5,414,299 A | 5/1995 | Wang et al. |
| 5,417,905 A | 5/1995 | Lemaire et al. |
| 5,424,576 A | 6/1995 | Djennas et al. |
| 5,428,248 A | 6/1995 | Cha et al. |
| 5,435,057 A | 7/1995 | Bindra et al. |
| 5,444,301 A | 8/1995 | Song et al. |
| 5,452,511 A | 9/1995 | Chang |
| 5,454,905 A | 10/1995 | Fogelson |
| 5,467,032 A | 11/1995 | Lee |
| 5,474,958 A | 12/1995 | Djennas et al. |
| 5,484,274 A | 1/1996 | Neu et al. |
| 5,493,151 A | 2/1996 | Asada et al. |
| 5,508,556 A | 4/1996 | Lin et al. |
| 5,517,056 A | 5/1996 | Bigler et al. |
| 5,521,429 A | 5/1996 | Aono et al. |
| 5,528,076 A | 6/1996 | Pavio et al. |
| 5,534,467 A | 7/1996 | Rostoker et al. |
| 5,539,251 A | 7/1996 | Iverson et al. |
| 5,543,657 A | 8/1996 | Diffenderfer et al. |
| 5,544,412 A | 8/1996 | Romero et al. |
| 5,545,923 A | 8/1996 | Barber et al. |
| 5,581,122 A | 12/1996 | Chao et al. |
| 5,592,019 A | 1/1997 | Ueda et al. |
| 5,592,025 A | 1/1997 | Clark et al. |
| 5,594,274 A | 1/1997 | Suetaki et al. |
| 5,595,934 A | 1/1997 | Kim et al. |
| 5,604,376 A | 2/1997 | Hamburgen et al. |
| 5,608,265 A | 3/1997 | Kitano et al. |
| 5,608,267 A | 3/1997 | Mahulikar et al. |
| 5,625,222 A | 4/1997 | Yoneda et al. |
| 5,633,528 A | 5/1997 | Abbott |
| 5,637,922 A | 6/1997 | Fillion et al. |
| 5,639,990 A | 6/1997 | Nishihara et al. |
| 5,640,047 A | 6/1997 | Nakashima et al. |
| 5,641,997 A | 6/1997 | Ohta et al. |
| 5,643,433 A | 7/1997 | Fukase et al. |
| 5,644,169 A | 7/1997 | Chun et al. |
| 5,646,831 A | 7/1997 | Manteghi et al. |
| 5,650,663 A | 7/1997 | Parthasarathi et al. |
| 5,661,088 A | 8/1997 | Tessier et al. |
| 5,665,996 A | 9/1997 | Williams et al. |
| 5,673,479 A | 10/1997 | Hawthorne et al. |
| 5,683,806 A | 11/1997 | Sakumoto et al. |
| 5,683,943 A | 11/1997 | Yamada et al. |
| 5,689,135 A | 11/1997 | Ball et al. |
| 5,696,666 A | 12/1997 | Miles et al. |
| 5,701,034 A | 12/1997 | Marrs et al. |
| 5,703,407 A | 12/1997 | Hori et al. |
| 5,710,064 A | 1/1998 | Song et al. |
| 5,723,899 A | 3/1998 | Shin et al. |
| 5,724,233 A | 3/1998 | Honda et al. |
| 5,726,493 A | 3/1998 | Yamashita et al. |
| 5,736,432 A | 4/1998 | Mackessy et al. |
| 5,745,984 A | 5/1998 | Cole et al. |
| 5,753,532 A | 5/1998 | Sim et al. |
| 5,753,977 A | 5/1998 | Kusaka et al. |
| 5,766,972 A | 6/1998 | Takahashi et al. |
| 5,767,566 A | 6/1998 | Suda et al. |
| 5,770,888 A | 6/1998 | Song et al. |
| 5,776,798 A | 7/1998 | Quan et al. |
| 5,783,861 A | 7/1998 | Son et al. |
| 5,801,440 A | 9/1998 | Chu et al. |
| 5,814,877 A | 9/1998 | Diffenderfer et al. |
| 5,814,881 A | 9/1998 | Alagaratnam et al. |
| 5,814,883 A | 9/1998 | Sawai et al. |
| 5,814,884 A | 9/1998 | Davis et al. |
| 5,817,540 A | 10/1998 | Wark |
| 5,818,105 A | 10/1998 | Kouda et al. |
| 5,821,457 A | 10/1998 | Mosley et al. |
| 5,821,615 A | 10/1998 | Lee et al. |
| 5,834,830 A | 11/1998 | Cho et al. |
| 5,835,988 A | 11/1998 | Ishii et al. |
| 5,844,306 A | 12/1998 | Fujita et al. |
| 5,854,511 A | 12/1998 | Shin et al. |
| 5,854,512 A | 12/1998 | Manteghi et al. |
| 5,856,911 A | 1/1999 | Riley et al. |
| 5,859,471 A | 1/1999 | Kuraishi et al. |
| 5,866,939 A | 2/1999 | Shin et al. |
| 5,866,942 A | 2/1999 | Suzuki et al. |
| 5,871,782 A | 2/1999 | Choi |
| 5,874,784 A | 2/1999 | Aoki et al. |
| 5,877,043 A | 3/1999 | Alcoe et al. |
| 5,886,397 A | 3/1999 | Ewer et al. |
| 5,973,935 A | 10/1999 | Schoenfeld et al. |
| 5,977,630 A | 11/1999 | Woodworth et al. |
| RE36,773 E | 7/2000 | Nomi et al. |

(56) References Cited

U.S. PATENT DOCUMENTS

| | | | |
|---|---|---|---|
| 6,107,679 | A | 8/2000 | Noguchi et al. |
| 6,143,981 | A | 11/2000 | Glenn et al. |
| 6,150,709 | A | 11/2000 | Shin et al. |
| 6,166,430 | A | 12/2000 | Yamaguchi et al. |
| 6,169,329 | B1 | 1/2001 | Farnworth et al. |
| 6,177,718 | B1 | 1/2001 | Kozono |
| 6,181,002 | B1 | 1/2001 | Juso et al. |
| 6,184,465 | B1 | 2/2001 | Corisis |
| 6,184,573 | B1 | 2/2001 | Pu |
| 6,194,777 | B1 | 2/2001 | Abbott et al. |
| 6,197,615 | B1 | 3/2001 | Song et al. |
| 6,198,171 | B1 | 3/2001 | Huang et al. |
| 6,201,186 | B1 | 3/2001 | Daniels et al. |
| 6,201,292 | B1 | 3/2001 | Yagi et al. |
| 6,204,554 | B1 | 3/2001 | Ewer et al. |
| 6,208,020 | B1 | 3/2001 | Minamio et al. |
| 6,208,021 | B1 | 3/2001 | Ohuchi et al. |
| 6,208,023 | B1 | 3/2001 | Nakayama et al. |
| 6,211,462 | B1 | 4/2001 | Carter, Jr. et al. |
| 6,218,731 | B1 | 4/2001 | Huang et al. |
| 6,222,258 | B1 | 4/2001 | Asano et al. |
| 6,222,259 | B1 | 4/2001 | Park et al. |
| 6,225,146 | B1 | 5/2001 | Yamaguchi et al. |
| 6,229,200 | B1 | 5/2001 | Mclellan et al. |
| 6,229,205 | B1 | 5/2001 | Jeong et al. |
| 6,238,952 | B1 | 5/2001 | Lin |
| 6,239,367 | B1 | 5/2001 | Hsuan et al. |
| 6,239,384 | B1 | 5/2001 | Smith et al. |
| 6,242,281 | B1 | 6/2001 | Mclellan et al. |
| 6,256,200 | B1 | 7/2001 | Lam et al. |
| 6,258,629 | B1 | 7/2001 | Niones et al. |
| 6,261,864 | B1 | 7/2001 | Jung et al. |
| 6,281,566 | B1 | 8/2001 | Magni |
| 6,281,568 | B1 | 8/2001 | Glenn et al. |
| 6,282,094 | B1 | 8/2001 | Lo et al. |
| 6,282,095 | B1 | 8/2001 | Houghton et al. |
| 6,285,075 | B1 | 9/2001 | Combs et al. |
| 6,291,271 | B1 | 9/2001 | Lee et al. |
| 6,291,273 | B1 | 9/2001 | Miyaki et al. |
| 6,294,100 | B1 | 9/2001 | Fan et al. |
| 6,294,830 | B1 | 9/2001 | Fjelstad |
| 6,295,977 | B1 | 10/2001 | Ripper et al. |
| 6,297,548 | B1 | 10/2001 | Moden et al. |
| 6,303,984 | B1 | 10/2001 | Corisis |
| 6,303,997 | B1 | 10/2001 | Lee |
| 6,306,685 | B1 | 10/2001 | Liu et al. |
| 6,307,272 | B1 | 10/2001 | Takahashi et al. |
| 6,309,909 | B1 | 10/2001 | Ohgiyama |
| 6,316,822 | B1 | 11/2001 | Venkateshwaran et al. |
| 6,316,838 | B1 | 11/2001 | Ozawa et al. |
| 6,323,550 | B1 | 11/2001 | Martin et al. |
| 6,326,243 | B1 | 12/2001 | Suzuya et al. |
| 6,326,244 | B1 | 12/2001 | Brooks et al. |
| 6,326,678 | B1 | 12/2001 | Karnezos et al. |
| 5,814,884 | C1 | 1/2002 | Davis et al. |
| 6,335,564 | B1 | 1/2002 | Pour |
| 6,337,510 | B1 | 1/2002 | Chun-Jen et al. |
| 6,339,252 | B1 | 1/2002 | Niones et al. |
| 6,339,255 | B1 | 1/2002 | Shin |
| 6,342,730 | B1 | 1/2002 | Jung et al. |
| 6,348,726 | B1 | 2/2002 | Bayan et al. |
| 6,355,502 | B1 | 3/2002 | Kang et al. |
| 6,359,221 | B1 | 3/2002 | Yamada et al. |
| 6,362,525 | B1 | 3/2002 | Rahim |
| 6,369,447 | B2 | 4/2002 | Mori |
| 6,369,454 | B1 | 4/2002 | Chung |
| 6,373,127 | B1 | 4/2002 | Baudouin et al. |
| 6,377,464 | B1 | 4/2002 | Hashemi et al. |
| 6,380,048 | B1 | 4/2002 | Boon et al. |
| 6,384,472 | B1 | 5/2002 | Huang |
| 6,388,336 | B1 | 5/2002 | Venkateshwaran et al. |
| 6,395,578 | B1 | 5/2002 | Shin et al. |
| 6,399,415 | B1 | 6/2002 | Bayan et al. |
| 6,400,004 | B1 | 6/2002 | Fan et al. |
| 6,410,979 | B2 | 6/2002 | Abe |
| 6,414,385 | B1 | 7/2002 | Huang et al. |
| 6,420,779 | B1 | 7/2002 | Sharma et al. |
| 6,421,013 | B1 | 7/2002 | Chung |
| 6,423,643 | B1 | 7/2002 | Furuhata et al. |
| 6,429,508 | B1 | 8/2002 | Gang |
| 6,437,429 | B1 | 8/2002 | Su et al. |
| 6,444,499 | B1 | 9/2002 | Swiss et al. |
| 6,448,633 | B1 | 9/2002 | Yee et al. |
| 6,452,279 | B2 | 9/2002 | Shimoda |
| 6,459,148 | B1 | 10/2002 | Chun-Jen et al. |
| 6,464,121 | B2 | 10/2002 | Reijnders |
| 6,465,883 | B2 | 10/2002 | Olofsson et al. |
| 6,472,735 | B2 | 10/2002 | Isaak |
| 6,475,646 | B2 | 11/2002 | Park et al. |
| 6,476,469 | B2 | 11/2002 | Hung et al. |
| 6,476,474 | B1 | 11/2002 | Hung |
| 6,482,680 | B1 | 11/2002 | Khor et al. |
| 6,483,178 | B1 | 11/2002 | Chuang |
| 6,492,718 | B2 | 12/2002 | Ohmori |
| 6,495,909 | B2 | 12/2002 | Jung et al. |
| 6,498,099 | B1 | 12/2002 | McLellan et al. |
| 6,498,392 | B2 | 12/2002 | Azuma |
| 6,501,165 | B1 | 12/2002 | Farnworth et al. |
| 6,507,096 | B2 | 1/2003 | Gang |
| 6,507,120 | B2 | 1/2003 | Lo et al. |
| 6,518,089 | B2 | 2/2003 | Coyle |
| 6,525,942 | B2 | 2/2003 | Huang et al. |
| 6,528,893 | B2 | 3/2003 | Jung et al. |
| 6,534,849 | B1 | 3/2003 | Gang |
| 6,545,332 | B2 | 4/2003 | Huang |
| 6,545,345 | B1 | 4/2003 | Glenn et al. |
| 6,552,421 | B2 | 4/2003 | Kishimoto et al. |
| 6,559,525 | B2 | 5/2003 | Huang |
| 6,566,168 | B2 | 5/2003 | Gang |
| 6,580,161 | B2 | 6/2003 | Kobayakawa |
| 6,583,503 | B2 | 6/2003 | Akram et al. |
| 6,585,905 | B1 | 7/2003 | Fan et al. |
| 6,603,196 | B2 | 8/2003 | Lee et al. |
| 6,624,005 | B1 | 9/2003 | DiCaprio et al. |
| 6,627,977 | B1 | 9/2003 | Foster |
| 6,646,339 | B1 | 11/2003 | Ku et al. |
| 6,667,546 | B2 | 12/2003 | Huang et al. |
| 6,677,663 | B1 | 1/2004 | Ku et al. |
| 6,686,649 | B1 | 2/2004 | Mathews et al. |
| 6,696,752 | B2 | 2/2004 | Su et al. |
| 6,700,189 | B2 | 3/2004 | Shibata |
| 6,713,375 | B2 | 3/2004 | Shenoy |
| 6,757,178 | B2 | 6/2004 | Okabe et al. |
| 6,800,936 | B2 | 10/2004 | Kosemura et al. |
| 6,812,552 | B2 | 11/2004 | Islam et al. |
| 6,818,973 | B1 | 11/2004 | Foster |
| 6,838,761 | B2 | 1/2005 | Karnezos |
| 6,858,919 | B2 | 2/2005 | Seo et al. |
| 6,861,288 | B2 | 3/2005 | Shim et al. |
| 6,867,492 | B2 | 3/2005 | Auburger et al. |
| 6,876,068 | B1 | 4/2005 | Lee et al. |
| 6,878,571 | B2 | 4/2005 | Isaak et al. |
| 6,897,552 | B2 | 5/2005 | Nakao |
| 6,906,416 | B2 | 6/2005 | Karnezos |
| 6,927,478 | B2 | 8/2005 | Paek |
| 6,933,598 | B2 | 8/2005 | Karnezos |
| 6,946,323 | B1 | 9/2005 | Heo |
| 6,967,125 | B2 | 11/2005 | Fee et al. |
| 6,972,481 | B2 | 12/2005 | Karnezos |
| 6,995,459 | B2 | 2/2006 | Lee et al. |
| 7,002,805 | B2 | 2/2006 | Lee et al. |
| 7,005,327 | B2 | 2/2006 | Kung et al. |
| 7,015,571 | B2 | 3/2006 | Chang et al. |
| 7,034,387 | B2 | 4/2006 | Karnezos |
| 7,045,396 | B2 | 5/2006 | Crowley et al. |
| 7,045,887 | B2 | 5/2006 | Karnezos |
| 7,049,691 | B2 | 5/2006 | Karnezos |
| 7,053,469 | B2 | 5/2006 | Koh et al. |
| 7,053,476 | B2 | 5/2006 | Karnezos |
| 7,053,477 | B2 | 5/2006 | Karnezos et al. |
| 7,057,269 | B2 | 6/2006 | Karnezos |
| 7,061,088 | B2 | 6/2006 | Karnezos |
| 7,064,426 | B2 | 6/2006 | Karnezos |
| 7,075,816 | B2 | 7/2006 | Fee et al. |

(56) References Cited

U.S. PATENT DOCUMENTS

| | | |
|---|---|---|
| 7,101,731 B2 | 9/2006 | Karnezos |
| 7,102,209 B1 | 9/2006 | Bayan et al. |
| 7,109,572 B2 | 9/2006 | Fee et al. |
| 7,166,494 B2 | 1/2007 | Karnezos |
| 7,169,642 B2 | 1/2007 | Karnezos |
| 7,185,426 B1 | 3/2007 | Hiner et al. |
| 7,193,298 B2 | 3/2007 | Hong et al. |
| 7,202,554 B1 | 4/2007 | Kim et al. |
| 7,205,647 B2 | 4/2007 | Karnezos |
| 7,211,471 B1 | 5/2007 | Foster |
| 7,245,007 B1 | 7/2007 | Foster |
| 7,247,519 B2 | 7/2007 | Karnezos et al. |
| 7,253,503 B1 | 8/2007 | Fusaro et al. |
| 7,253,511 B2 | 8/2007 | Karnezos et al. |
| 7,271,496 B2 | 9/2007 | Kim |
| 7,279,361 B2 | 10/2007 | Karnezos |
| 7,288,434 B2 | 10/2007 | Karnezos |
| 7,288,835 B2 | 10/2007 | Yim et al. |
| 7,298,037 B2 | 11/2007 | Yim et al. |
| 7,298,038 B2 | 11/2007 | Filoteo, Jr. et al. |
| 7,306,973 B2 | 12/2007 | Karnezos |
| 7,312,519 B2 | 12/2007 | Song et al. |
| 7,375,416 B2 | 5/2008 | Retuta et al. |
| 7,982,298 B1 | 7/2011 | Kang et al. |
| 8,106,495 B2 | 1/2012 | Kajiki |
| 2001/0008305 A1 | 7/2001 | McLellan et al. |
| 2001/0014538 A1 | 8/2001 | Kwan et al. |
| 2002/0011654 A1 | 1/2002 | Kimura |
| 2002/0024122 A1 | 2/2002 | Jung et al. |
| 2002/0027297 A1 | 3/2002 | Ikenaga et al. |
| 2002/0038873 A1 | 4/2002 | Hiyoshi |
| 2002/0072147 A1 | 6/2002 | Sayanagi et al. |
| 2002/0111009 A1 | 8/2002 | Huang et al. |
| 2002/0140061 A1 | 10/2002 | Lee |
| 2002/0140068 A1 | 10/2002 | Lee et al. |
| 2002/0140081 A1 | 10/2002 | Chou et al. |
| 2002/0158318 A1 | 10/2002 | Chen |
| 2002/0163015 A1 | 11/2002 | Lee et al. |
| 2002/0167060 A1 | 11/2002 | Buijsman et al. |
| 2003/0001244 A1 | 1/2003 | Araki et al. |
| 2003/0006055 A1 | 1/2003 | Chien-Hung et al. |
| 2003/0030131 A1 | 2/2003 | Lee et al. |
| 2003/0059644 A1 | 3/2003 | Datta et al. |
| 2003/0064548 A1 | 4/2003 | Isaak |
| 2003/0073265 A1 | 4/2003 | Hu et al. |
| 2003/0102537 A1 | 6/2003 | McLellan et al. |
| 2003/0164554 A1 | 9/2003 | Fee et al. |
| 2003/0168719 A1 | 9/2003 | Cheng et al. |
| 2003/0198032 A1 | 10/2003 | Collander et al. |
| 2004/0027788 A1 | 2/2004 | Chiu et al. |
| 2004/0056277 A1 | 3/2004 | Karnezos |
| 2004/0061212 A1 | 4/2004 | Karnezos |
| 2004/0061213 A1 | 4/2004 | Karnezos |
| 2004/0063242 A1 | 4/2004 | Karnezos |
| 2004/0063246 A1 | 4/2004 | Karnezos |
| 2004/0065963 A1 | 4/2004 | Karnezos |
| 2004/0080025 A1 | 4/2004 | Kasahara et al. |
| 2004/0089926 A1 | 5/2004 | Hsu et al. |
| 2004/0164387 A1 | 8/2004 | Ikenaga et al. |
| 2004/0253803 A1 | 12/2004 | Tomono et al. |
| 2005/0184377 A1 | 8/2005 | Takeuchi et al. |
| 2006/0087020 A1 | 4/2006 | Hirano et al. |
| 2006/0157843 A1 | 7/2006 | Hwang |
| 2006/0231928 A1 | 10/2006 | Dotta et al. |
| 2006/0231939 A1 | 10/2006 | Kawabata et al. |
| 2007/0023202 A1 | 2/2007 | Shibata et al. |
| 2007/0152313 A1 | 7/2007 | Periaman et al. |
| 2008/0142941 A1 | 6/2008 | Yew et al. |
| 2008/0230887 A1 | 9/2008 | Sun et al. |
| 2008/0272465 A1 | 11/2008 | Do et al. |
| 2009/0014851 A1 | 1/2009 | Choi et al. |
| 2009/0057918 A1 | 3/2009 | Kim |

FOREIGN PATENT DOCUMENTS

| | | |
|---|---|---|
| EP | 0459493 | 12/1991 |
| EP | 0720225 | 3/1996 |
| EP | 0720234 | 3/1996 |
| EP | 0794572 A2 | 10/1997 |
| EP | 0844665 | 5/1998 |
| EP | 0989608 | 3/2000 |
| EP | 1032037 | 8/2000 |
| JP | 55163868 | 12/1980 |
| JP | 5745959 | 3/1982 |
| JP | 58160096 | 8/1983 |
| JP | 59208756 | 11/1984 |
| JP | 59227143 | 12/1984 |
| JP | 60010756 | 1/1985 |
| JP | 60116239 | 8/1985 |
| JP | 60195957 | 10/1985 |
| JP | 60231349 | 11/1985 |
| JP | 6139555 | 2/1986 |
| JP | 61248541 | 11/1986 |
| JP | 629639 | 1/1987 |
| JP | 6333854 | 2/1988 |
| JP | 63067762 | 3/1988 |
| JP | 63188964 | 8/1988 |
| JP | 63205935 | 8/1988 |
| JP | 63233555 | 9/1988 |
| JP | 63249345 | 10/1988 |
| JP | 63289951 | 11/1988 |
| JP | 63316470 | 12/1988 |
| JP | 64054749 | 3/1989 |
| JP | 1106456 | 4/1989 |
| JP | 1175250 | 7/1989 |
| JP | 1205544 | 8/1989 |
| JP | 1251747 | 10/1989 |
| JP | 2129948 | 5/1990 |
| JP | 369248 | 7/1991 |
| JP | 3177060 | 8/1991 |
| JP | 3289162 | 12/1991 |
| JP | 4098864 | 3/1992 |
| JP | 5129473 | 5/1993 |
| JP | 5166992 | 7/1993 |
| JP | 5283460 | 10/1993 |
| JP | 6061401 | 3/1994 |
| JP | 692076 | 4/1994 |
| JP | 6140563 | 5/1994 |
| JP | 6252333 | 9/1994 |
| JP | 6260532 | 9/1994 |
| JP | 7297344 | 11/1995 |
| JP | 7312405 | 11/1995 |
| JP | 8064364 | 3/1996 |
| JP | 8083877 | 3/1996 |
| JP | 8125066 | 5/1996 |
| JP | 964284 | 6/1996 |
| JP | 8222682 | 8/1996 |
| JP | 8306853 | 11/1996 |
| JP | 08-340072 A | 12/1996 |
| JP | 98205 | 1/1997 |
| JP | 98206 | 1/1997 |
| JP | 98207 | 1/1997 |
| JP | 992775 | 4/1997 |
| JP | 9260568 | 10/1997 |
| JP | 9293822 | 11/1997 |
| JP | 10022447 | 1/1998 |
| JP | 10199934 | 7/1998 |
| JP | 10256240 | 9/1998 |
| JP | 11307675 | 11/1999 |
| JP | 2000130765 | 5/2000 |
| JP | 20010600648 | 3/2001 |
| JP | 2002519848 | 7/2002 |
| JP | 200203497 | 8/2002 |
| KR | 941979 | 1/1994 |
| KR | 19940010938 | 5/1994 |
| KR | 19950018924 | 6/1995 |
| KR | 19950041844 | 11/1995 |
| KR | 19950044554 | 11/1995 |
| KR | 19950052621 | 12/1995 |
| KR | 1996074111 | 12/1996 |
| KR | 9772358 | 11/1997 |
| KR | 100220154 | 6/1999 |

(56) References Cited

FOREIGN PATENT DOCUMENTS

| | | |
|---|---|---|
| KR | 20000072714 | 12/2000 |
| KR | 20000086238 | 12/2000 |
| KR | 20020049944 | 6/2002 |
| KR | 1020070084060 | 8/2007 |
| WO | EP0936671 | 8/1999 |
| WO | 9956316 | 11/1999 |
| WO | 9967821 | 12/1999 |
| WO | 2005/048311 A3 | 5/2005 |

OTHER PUBLICATIONS

Vishay, "4 Milliohms in the So-8: Vishay Siliconix Sets New Record for Power MOSFET On-Resistance," Press Release from webpage, 3 pages, www.vishay.com/news/releases, Nov. 7, 2002.

Patrick Mannion, "MOSFETs Break out of the Shackles of Wire Bonding," Informational Packet, 5 pages, Electronic Design, Mar. 22, 1999 vol. 47, No. 6, www.elecdesign.com/1999/mar2299/ti/0322ti1.shtml.

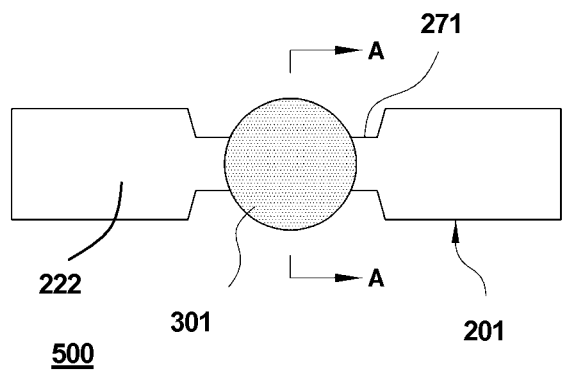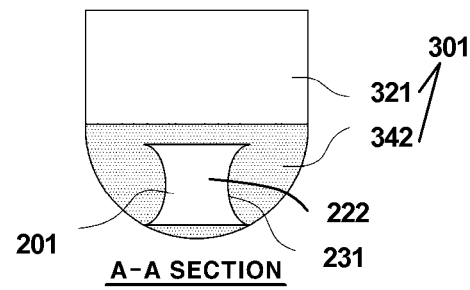
FIG. 5          FIG. 5A
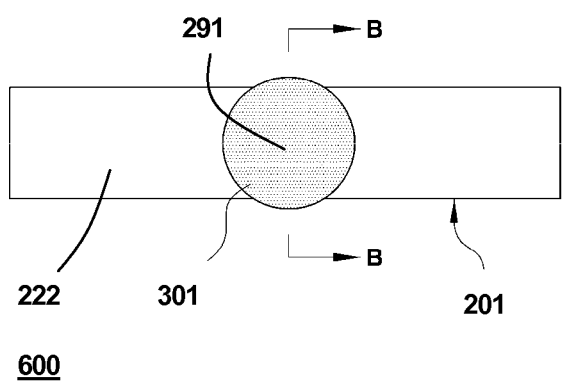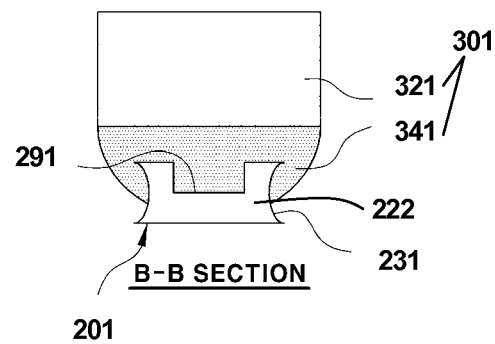
FIG. 6          FIG. 6A

SEMICONDUCTOR PACKAGE AND METHOD THEREFOR

CROSS REFERENCE TO RELATED APPLICATION

This application claims priority to Korean Patent Application No. 10-2013-0126885 filed on Oct. 24, 2013, which is expressly incorporated by reference herein.

BACKGROUND

Embodiments disclosed herein relate generally to electronic packages, and, more particularly, to a semiconductor package in which a solder joint for joining a flip chip lead frame and an electronic device is improved in structure to have an enhanced coupling force and method of fabricating the same.

Generally, a conductive lead frame is a type of substrate used for fabricating a semiconductor package. The lead frame is the central supporting structure of such a package, and typically is fabricated by chemically etching or mechanically stamping a metal strip. The lead frame typically includes a side frame defining an entire framework, a chip pad for mounting one or more semiconductor chips, one or more tie bars integrally connecting the side frame to the chip pad, and a plurality of leads extending from the side frame in such a way as to be adjacent or proximate to all sides of the chip pad. A portion of the lead frame is internal to the package body or completely surrounded by a plastic encapsulant, such as a mold compound. Portions of the leads of the leadframe may extend externally from the package body or may be partially exposed therein for use in electrically connecting the package to another component. In certain semiconductor packages, a portion of the die pad of the leadframe also remains exposed within the package body.

There is a class of semiconductor packages referred to as near chip scale packages (CSP) that include very thin, fine pitch, and small area lead frames that approximate the size of the semiconductor chip. Such packages include the MicroLeadFrame® (MLF) style of packages. These packages typically have package body sizes in the 1 mm to 13 mm range and package heights in the 0.3 mm to 2.1 mm range. In order to enhance unit productivity, near chip scale packages such as MLF style packages are assembled in a matrix of multiple leadframes and encapsulated in an overmolding process. The individual MLF structures are then separated into individual packages typically using a sawing process, which cuts through the mold compound and the lead frames.

In some applications, flip chip attachment of semiconductor chips to lead frames is continuing to grow compared semiconductor chips connected using conductive wires. The growth of flip chip attachment is being driven by, among other things, form factor and product performance. Types of semiconductor chips seeing growth in flip chip attachment include microprocessors, application specific integrated circuits (ASICs), field programmable gate arrays (FPGAs), digital signal processors (DSPs), media products, and graphics chips, among others.

Earlier versions of flip chip attached semiconductor chips used evaporated bumps (e.g., C4 bumps) and electroplated bumps (e.g., high-Pb bumps). Currently, the industry is moving towards an expanded use of conductive pillar structures (e.g., copper pillar structures) particularly with smaller geometry process nodes. Copper pillar structures are preferred because, among other things, they are configured to provide small form factors to support smaller die sizes, improved electrical performance, and greener (i.e., lead-free) manufacturing solutions.

Using conductive pillar structures with near chip scale packages, such as MLF style packages has presented several manufacturing problems. Specifically, with the industry requirement for lead frames to have very fine lead pitches, the width of each lead is being reduced. Also, in order to improve electrical performance, the size of the conductive bumps, such as copper pillars, is being increased. However, with the reduced lead widths the solder joint formed between the pillar and the lead has been found to be unsatisfactorily weak and a source of reliability problems.

Accordingly, it is desirable to have a semiconductor package structure and method that overcome the issues with related flip chip packages described previously, as well as others. It is also desirable to have a structure and method that is cost effective, easy to integrate into assembly process flows, and reliable.

BRIEF DESCRIPTION OF THE DRAWINGS

FIG. 5 illustrates a partial top view of an electronic package lead structure in accordance with an embodiment of the present invention;

FIG. 5A illustrates a cross-sectional view of the embodiment of FIG. 5;

FIG. 6 illustrates a partial top view of an electronic package lead structure in accordance with a further embodiment of the present invention;

FIG. 6A illustrates a cross-sectional view of the embodiment of FIG. 6;

For simplicity and clarity of the illustration, elements in the figures are not necessarily drawn to scale, and the same reference numbers in different figures can denote the same elements. The use of the word about, approximately or substantially means that a value of an element has a parameter that is expected to be close to a stated value or position. However, as is well known in the art there are always minor variances that prevent the values or positions from being exactly as stated. Additionally, descriptions and details of well-known steps and elements may be omitted for simplicity of the description.

DETAILED DESCRIPTION OF THE DRAWINGS

The aspects of the present invention and methods for achieving the aspects will be apparent by referring to the embodiments to be described herein with reference to the accompanying drawings. It is understood that the embodiments described herein are illustrative only and that the present invention is not limited thereto, but can be implemented in alternative forms. Also, it is understood that the features of the various embodiments described herein can be combined with each other, unless specifically noted otherwise.

In general, the present embodiments relate to a structure and method for providing a stronger joining force for the bonding joint between conductive leads within a lead frame and the solder of conductive bumps. This stronger joining force is provided even if the lead width is reduced to support finer pitch lead frames and even if the width of the conductive pillars is increased. In one embodiment, each lead is configured having a width smaller than the width of the conductive bump and further configured to facilitate the flow of solder from the conductive bump partially or completely around each lead to provide a strengthened solder joint. In one embodiment, the bond finger portion of each lead is configured to strengthen the solder joint. In another embodiment, the land portion of each lead is configured to strengthen the solder joint. In one embodiment, each lead is configured having concave sides surface portions to provide the strengthened solder joint. In another embodiment, each lead is provided with a narrow neck portion that provides the strengthened solder joint. In a further embodiment, each lead is configured with a dimple portion that provides the strengthened solder joint.

Figure 1:
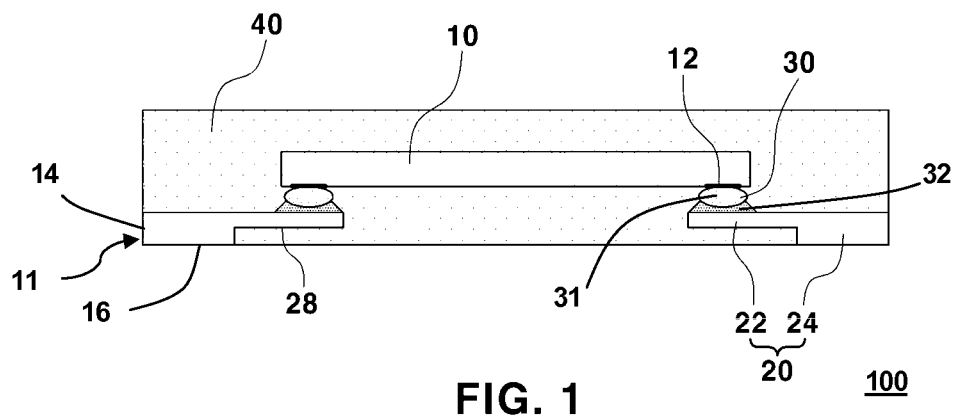
FIG. 1 shows a cross-sectional view of a flip chip electronic package structure.

Hereinafter, a semiconductor package 100 using a lead frame 11, such as micro lead frame, is described with reference to FIG. 1. FIG. 1 shows a cross-sectional view of a flip chip attached electronic device after semiconductor package 100 has been separated using a singulation process. As shown in FIG. 1, semiconductor package 100 includes an electronic device, such as a semiconductor chip 10 attached to leads 20 of a lead frame 11 (e.g., a micro lead frame) using a conductive bump 30. In a typical structure, semiconductor chip 10 includes a plurality of conductive bond pads 12 formed on a major surface of semiconductor chip 10 and electrically connected to various circuit elements within semiconductor chip 10. A passivation layer (not shown) is typically formed on bond pads 12 and has openings to expose portions of bond pads 12. An under bump metal (UBM) layer (not shown) is typically provided on the exposed portions of bond pads 12 and typically includes titanium and/or titanium-nitride. In a conductive pillar process, such as a copper pillar process, a photo-imageable resist (either a dry film or a spin-on film) is used to define where the pillar structure will be plated, and then a solder layer or solder cap can be applied to the tip of each pillar structure through a paste process or an electroplating process. The resist layer is then stripped, excess material can be etched, and then the solder layer can be subjected to a reflow process.

If bonding pads 12 on semiconductor chip 10 and each lead 20 were connected to each other by conductive wires as in the related art, a height for forming a loop of the conductive wires is required, thus undesirably leading to an increase in the entire thickness of the semiconductor package. Unlike a conductive wire structure, semiconductor package 100 is configured such that bonding pads 12 on semiconductor chip 10 and each lead 20 are connected to each other using the flip chip configuration in such a way as to enable the electric signal interchange to and from semiconductor chip 10 and leads 20. Thus, such a structure advantageously reduces the entire thickness of the semiconductor package and provides a lighter, thinner, smaller, and more compact product.

In one embodiment, each lead 20 of lead frame 11 is configured to function similar to a chip mounting board for mounting the semiconductor chip 10 thereon. In one embodiment, a ground pad is provided within a central portion proximate to an end portion of each lead 20. Further, each lead 20 includes a bond finger 22 where the flip chip is attached and a land portion 24 where semiconductor package 100 is attached to a next level of assembly (e.g., a motherboard). Land portion 24 further provides for electrical communication between semiconductor chip 10 and other electronic devices. A recessed or etched portion 28, which is reduced in thickness by, for example, etching, is formed on or extending inward from a lower surface of bond finger 22.

Semiconductor chip 10 is attached to bond fingers 22 of leads 20. Specifically, in one embodiment bonding pads 12 on semiconductor chip 10 are connected to the bond finger 22 of each lead 20 using a flip chip structure in such a way as to permit the electric signal interchange, and then a molding process is performed to seal the semiconductor chip 10, the flip chip structure, and at least portions of leads 20 with a molding compound resin 40 to provide related semiconductor package 100 as shown in FIG. 1.

Conductive bumps 30 include, for example, a copper pillar 31 and a solder portion or layer 32. As described previously, copper pillars 31 can be formed overlying bond pads 12 using electroplating techniques or other techniques as known to those of ordinary skill in the art. Solder portion 32 can be integrally formed on an end of copper pillar 31 by plating or by depositing a solder paste. In one embodiment, an outer surface 14 and a lower surface 16 of the land portion 24 of each lead 20 are exposed to the outside, and recessed portion 28 of each lead 20 is filled with molding compound resin 40, thus increasing a coupling force between each lead 20 and molding compound resin 40.

In related packages, copper pillar 31 of conductive bump 30 has a typical width or diameter of 50 microns. Bond fingers 22 of leads 20 typically have widths of 70 microns. This size configuration provides a pillar-to-lead ratio of 0.7, which allows solder portion 32 formed on the end of copper pillar 31 to be electrically fused to and easily seated on the top surface of bond finger 22 of each lead 20. However, if the width of each lead is reduced and the size of the conductive bump is increased to support the demand for fine pitch lead frames for each lead and the increase in size or width of the copper pillar portion of the conductive bump, the solder joint of the conductive bump relative to each lead has been found to be weakened. The following embodiments are configured to address, among other things, strengthening this solder joint.

Figure 2:
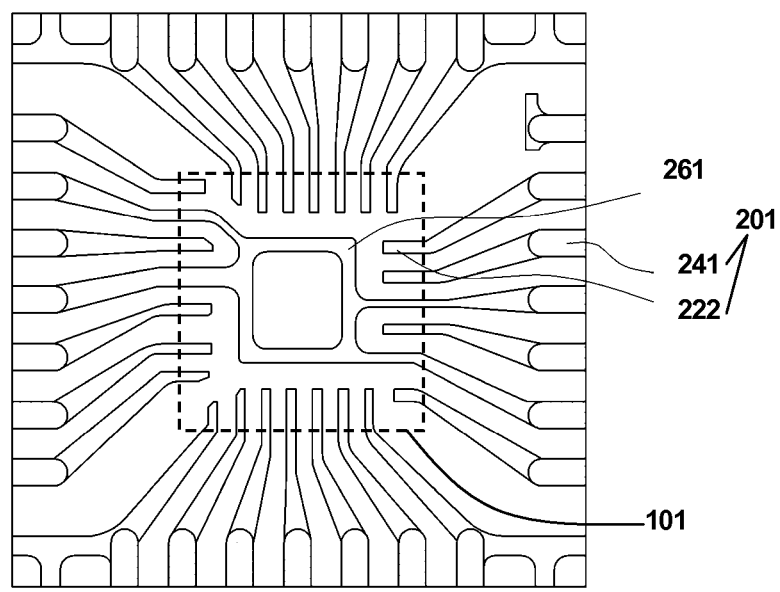
FIG. 2 shows a lead frame structure for use in embodiments of the present invention.

FIG. 2 illustrates a top view of a lead frame 200 for use with the present embodiments. In one embodiment, lead frame 200 is configured, for example, as a micro lead frame and includes a plurality of leads 201. Leads 201 of lead frame 200 are configured to function similar to a chip mounting board for mounting a semiconductor chip 101 thereon. In one embodiment, ground pad 261 is provided within a central portion proximate to an end portion of each lead 201. In one embodiment, plurality of leads 201 can include at least four sets disposed proximate to four sides of ground pad 261. Further, each lead 201 can include a bond finger 222 where electronic chip or semiconductor chip 101 is attached and a land portion 241 where the electronic package is attached to a next level of assembly (e.g., a motherboard). Land portion 241 further provides for electrical communication between semiconductor chip 101 mounted thereon and other electronic devices.

Figure 3:
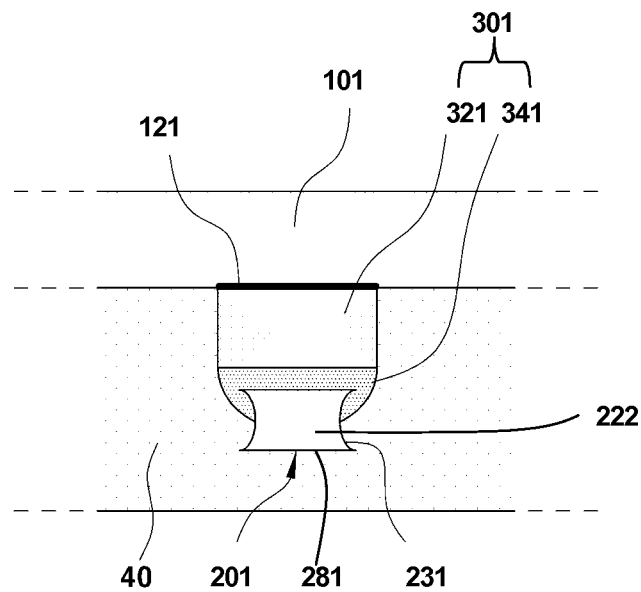
FIG. 3 illustrates a partial cross-sectional view of an electronic package in accordance with an embodiment of the present invention.

FIG. 3 illustrates a partial cross-sectional view of an electronic package 300, such as a semiconductor package 300, in accordance with a first embodiment including lead frame 200 illustrated in FIG. 2. Semiconductor package 300 is illustrated with one lead from the plurality of leads 201, which can be configured as a chip mounting pad or chip mounting board. In semiconductor package 300, lead 201 can include a bond finger 222 and a land portion 241 (illustrated in FIG. 2). In one embodiment, bond finger 222 can be formed in an inner region of lead 201 in a longitudinal direction thereof to serve as a place to which semiconductor chip 101 is flip chip attached. In one embodiment, land portion 241 can be formed in an outer region of each lead 201 to be electrically connected to a next level of assembly, such as a mother board and placed in electrical communication with other electronic devices. In some embodiments, an etched or recessed portion 281, which is reduced in thickness by etching, can be formed on a lower surface of bond finger 222.

Semiconductor chip 101 can be attached to or mounted to lead 201 using a conductive bump structure 301 or conductive bump 301. In one embodiment, conductive bump structure 301 is connected to a bond pad 121 on a surface of semiconductor chip 101 and connected to bond finger 222 of lead 201.

In accordance with the present embodiment, conductive bump structure 301 includes a conductive pillar 321 and a solder portion 341 or solder cap 341. In some embodiments, conductive pillar 321 includes a metallic material, such as copper or other materials as known to those of ordinary skill in the art. In one embodiment, conductive pillar 321 can be formed using a photo-imageable layer and an electroplating process. Solder portion 341 can then formed on a tip or end portion of conductive pillar 321 using an electroplating process or a solder paste deposition process. In one embodiment, solder portion 341 can be a silver/tin solder or another alloy solder. After solder portion 341 is formed, the photo-imageable layer can be removed. In an optional step, solder portion 341 and conductive pillar 321 can be subjected to a reflow process. In one embodiment, semiconductor chip 101 with conductive bump structures 301 is placed using, for example, a pick and place tool into contact with plurality of leads 201. The assembly is then subjected to an elevated temperature to reflow solder portion 341 to form a solder joint with lead 201.

Figures 7A, 7B:
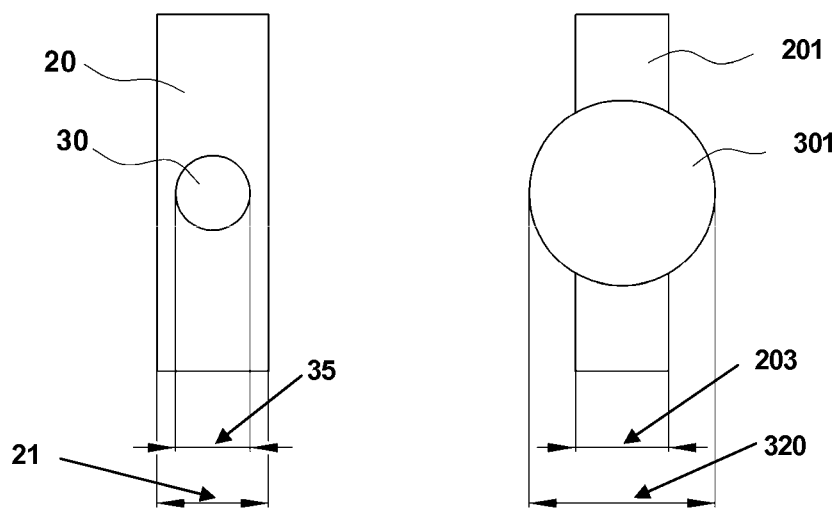
FIG. 7A illustrates a top view of a lead structure and a pillar structure of a related electronic package.
FIG. 7B illustrates a top view of a lead structure and a pillar structure of an electronic package in accordance with another embodiment of the present invention.

In accordance with the present embodiment and as illustrated in FIG. 7B, which is a top view of lead 201 (i.e., the upper bonding surface), the width 203 of each lead 201 (i.e., the width proximate to the upper bonding surface of the lead) is reduced compared to related packages as illustrated in FIG. 7A. In FIG. 7A, related lead 20 has a width 21, which is typically 70 microns or more. In one embodiment, the width 203 of each lead 201 is about 60 microns or less so as to support packages having finer lead pitches, such as micro lead frame packages. Further, in accordance with the present embodiment, conductive pillar 321 has a width 320 of about 120 microns or more so as to improve electrical performance of the packaged semiconductor device. In the related packages as illustrated in FIG. 7A, the related bump 30 has a width 35, which is typically 50 microns or less.

Stated another way, related devices typically have a bump-to-lead width ratio of about 0.7 or less whereas the present embodiment has a bump-to-lead width ratio of about 2 or more. In related devices, such a bump-to-lead width ratio would lead to weakened solder joints between the conductive bump and the leads as described previously. In accordance with the present embodiment, the semiconductor package 301 is configured to provide an enhanced solder joint or a stronger joining force for the joint between each lead 201 and solder portion 341 of conductive bump 301. More particularly, lead 201 is configured so that solder portion 341 at least partially surrounds the outer surface area of each lead 201. In one embodiment, solder portion 341 extends beyond the top surface of each lead 221 and attaches to at least portions of side surfaces of each lead 201 as generally illustrated in FIG. 3. In accordance with the present embodiment, even if the width of the lead 201 is reduced and the size of the copper pillar 321 is increased in this manner, it is possible to significantly strengthen a joining force for a joint between each lead 201 and solder portion 341 of conductive bump 301.

In some embodiments, each lead 201 is provided with a bond finger portion 222 configured to facilitate the flow of solder portion 341 around at least portions of the side surfaces of each lead 201. In a preferred embodiment, the side surfaces of each lead can be provided with a generally curved shape or concave portion 231 to further strengthen the joining force between bond finger 222 of each lead 201 and solder portion 341 of conductive bump 301 by filling at least portions of concave portions 231 with parts of solder portion 341. Concave portions 231 are configured to increase the surface area of the bonding surface for forming the solder joint with solder portion 341.

After the attachment process, at least portions of semiconductor chip 101, portions of each lead 201 and conductive bumps 301 are covered or encapsulated with molding compound resin 40 or encapsulating layer 40. In one embodiment, molding compound resin 40 can be formed using an overmolding process. After the overmolding process, the semiconductor packages can be separated into individual components using a singulation process, such as a sawing process. Portions of leads 201 and/or lead frame 200 (e.g., ground pad 261) can be exposed to the outside through molding compound resin.

Figure 4:
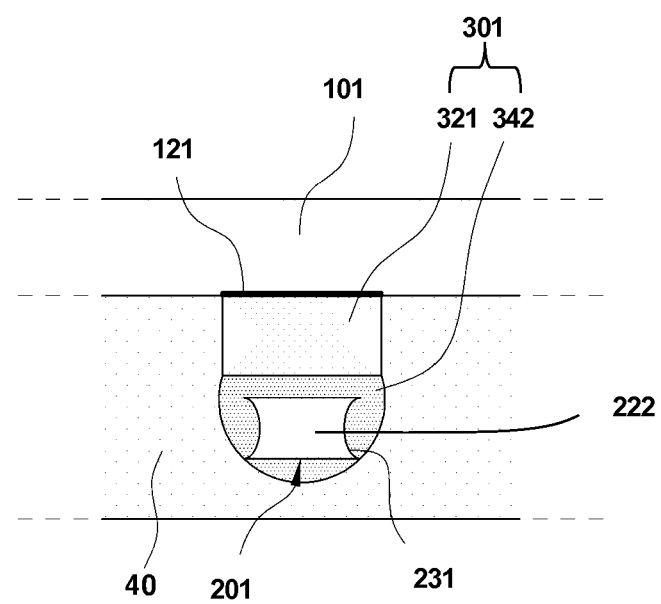
FIG. 4 illustrates a partial cross-sectional view of an electronic package in accordance with an embodiment of the present invention.

FIG. 4 illustrates a partial cross-sectional view of an electronic package 400, such as a semiconductor package 400, in accordance with a second embodiment. Semiconductor package 400 is similar to semiconductor package 300 except solder layer 342 in semiconductor package 400 extends all the way around or entirely surrounds a portion of bond finger 222 of lead 201 thus further enhancing or strengthening the joining force for the joint (i.e., solder joint) between each lead 201 and solder layer 342 of conductive bump 301. Even if the width of the lead 201 is reduced and the size of the copper pillar 321 is increased as illustrated in FIG. 7B, the present embodiment is configured to strengthen the joining force for a joint between each lead 201 and solder layer 342 of conductive bump 301.

FIG. 5 illustrates a partial top of an electronic package lead structure 500 in accordance with a third embodiment. FIG. 5A illustrates a cross-sectional view of lead structure 500 taken along reference line A-A in FIG. 5. In order to strengthen the joining force for the joint between the bond finger 222 of each lead 201 and the solder portion 341 of conductive bump 301, a portion of the bond finger 222 where solder layer 34 is to be fused is configured to have a narrow neck portion 271, which has a width smaller than an original width of the bond finger 222. Other portions of bond finger 222 can be of the original width to provide additional strength and/or stability to the structure. In one embodiment, narrow neck portion 271 is formed using masking and etching techniques.

In accordance with the present embodiment, when solder portion 342 formed on the end of copper pillar 321 of conductive bump 301 is soldered onto the upper surface of bond finger 222 of lead 201, solder portion 342 partially or completely surrounds the surface area of bond finger 222, and narrow neck 271 is formed on bond finger 222 of each lead 201. In this configuration solder portion 342 can more easily surround the surface area of a portion of bond finger 222, thus resulting in strengthening the joining force for the joint between bond finger 222 of each lead 201 and solder portion 342 of conductive bump 301. In one embodiment, lead structure 500 can include concave portions 231 along or in the side surfaces of neck portion 271.

FIG. 6 illustrates a partial top of an electronic package lead structure 600 in accordance with another embodiment. FIG. 6A illustrates a cross-sectional view of lead structure 600 taken along reference line B-B in FIG. 6. In order to strengthen the joining force for the joint between bond finger 222 of each lead 201 and solder portion 341 of the conductive bump 301, one or more dimples 291 can be formed on a major surface (e.g., the upper surface) of bond finger 222 onto which solder portion 341 is fused. In one embodiment, dimple 291 can be formed using a masking and etching process. In another embodiment, dimple 291 can be formed using stamping techniques. In an alternative embodiment dimple 291 can be formed in the lower surface of bond finger 222 when solder portion 341 completely surrounds a portion lead 201. In another embodiment, dimples 291 can be formed on both surfaces.

In accordance with the present embodiment, when solder portion 341 formed on the end of copper pillar 321 of conductive bump 301 is soldered onto the upper surface of bond finger 222 of lead 201, solder portion 341 partially or completely surrounds the surface area of the bond finger 222. In addition, dimple 291 is formed on bond finger 222 of each lead 201. In this configuration of bond finger 222, solder portion 341 can more easily surround the surface area of the bond finger 222 while filling dimple 291, thus resulting in strengthening the joining force for the joint between bond finger 222 of each lead 201 and solder portion 341 of conductive bump 301. Dimple 291 is configured to increase the surface area for forming the solder joint with solder portion 341. In one embodiment, lead structure 600 can include concave portions 231 along or in the side surfaces of bond finger 222. In one embodiment, dimple 291 is between a concave portions 231 as generally illustrated, for example, in FIG. 6A.

Those skilled in the art will appreciate that the described embodiments can also be implemented on land portions 241 of each lead 201 as well as bond fingers 222. By way of example, in land portion implementations, solder portion 341 preferably only partially surrounds the surface area of the land portions and such land portions can be configured to include one or more concave portions 231 to further enhance the strength of the bonding force between solder portion 341 and each lead 201.

From all of the foregoing, one skilled in the art can determine that according to one embodiment, a semiconductor package includes a semiconductor chip, a plurality of leads on which the semiconductor chip is mounted, a conductive bump electrically connecting a bonding pad of the semiconductor chip with a bond finger of each of the leads, and molding compound resin molded to seal the semiconductor chip, the leads, and the conductive bump. A size of a conductive pillar of the conductive bump is larger than a width of each of the leads, so that a solder is soldered while partially or completely surrounding a surface area of the bond finger, when the solder formed on an end of the conductive pillar is soldered onto an upper surface of the bond finger of the lead.

In another embodiment, a concave portion may be formed on each of opposite sides of the bond finger by an etching process. In a further embodiment, a portion of the bond finger onto which the solder is fused may undergo the etching process to form a narrow neck, which has a width smaller than an original width of the bond finger. In a still further embodiment, a dimple may be formed on the upper surface of the bond finger onto which the solder is fused.

From all of the foregoing, one skilled in the art can determine that according to another embodiment, a semiconductor package (for example, element 300, 400, 500, 600) comprises a plurality of leads (for example, element 201), each lead having a bond finger (for example, element 222). A semiconductor chip (for example, element 101) having a plurality of conductive bumps (for example, element 301), each conductive bump including a conductive pillar (for example, element 321) and a solder portion (for example, 341, 342), each conductive bump attached to one of the bond fingers. A molding compound resin (for example, element 40) is molded to seal the semiconductor chip, at least portions of the leads, and the conductive bump, wherein a width (for example, element 320) of the conductive pillar is larger than a width (for example, element 203) of each of the leads, and wherein the solder portion extends beyond an upper surface of the bond finger and at least partially surrounds a surface area of a portion of the bond finger.

In another embodiment, the solder portion (for example, element 342) completely surrounds the surface area of the portion of the bond finger. In a further embodiment, at least a portion of the surface area comprises a concave portion (for example, element 231). In a still further embodiment, each bond finger has concave portions (for example, element 231) on opposing side surfaces in cross-sectional view. In another embodiment, the semiconductor package can further comprise a dimple (for example, element 291) in a major surface of the bond finger, wherein the dimple is disposed between the concave portions. In a further embodiment, a portion of the bond finger where the conductive bump is attached comprises a narrow neck (for example, element 271), which has a width smaller than another width of the bond finger. In a still further embodiment, the semiconductor package can further comprise a dimple (for example, element 291) in a major surface of the bond finger, at least a portion of the solder portion disposed within the dimple. In another embodiment, the dimple can be in an upper major surface of the bond finger adjacent the semiconductor chip. In a further embodiment, the semiconductor package can have a bump-to-lead ratio of about 2 or more. In a still further embodiment, the semiconductor package can comprise a micro lead frame package (for example, element 200).

From all of the foregoing, one skilled in the art can determine that according to a further embodiment, an electronic package structure (for example, element 300, 400, 500, 600) comprises a lead (for example, element 20) having a first width (for example, element 203). An electronic chip (for example, element 101) having a conductive bump (for example, element 301) on a major surface, wherein the conductive bump has a second width (for example, element 320) greater than the first width, and wherein the conductive bump is attached to the lead, wherein a portion of the conductive bump extends to at least partially surround a side surface of the lead. A molding compound resin (for example, element 40) seals the electronic chip, the conductive bump, and at least a portion of the lead.

In another embodiment, the lead further comprises a bond finger (for example, element 222) having the first width, wherein the conductive bump is attached to the bond finger. In a further embodiment, side surfaces of the lead have concave portions (for example, element 231). In a still further embodiment, the electronic package can further comprise a dimple (for example, element 291) in a major surface of the lead, wherein a portion of the conductive bump is within the dimple. In another embodiment, the portion (for example, element 342) of the conductive bump completely surrounds a portion of the lead. In a still further embodiment, the conductive bump comprises a conductive pillar (for example, element 321) and a solder portion (for example, element 341) on a tip of the conductive pillar, wherein the solder portion extends to at least partially cover sides surfaces the lead. In another embodiment, the lead further comprises a narrow neck portion (for example, element 291), the narrow neck portion having the first width, and wherein the lead has a third width greater than the first width. In a further embodiment, the second width to first width ratio is about 2 or more.

From all of the foregoing, one skilled in the art can determine that according to a still further embodiment, a method for forming a semiconductor package (for example, element 300, 400, 500, 600) comprises providing a lead frame (for example, element 200) having a lead (for example, element 201), the lead having a first width (for example, element 203. The method includes providing a semiconductor chip (for example, element 101) having a conductive bump (for example, element 301) on a major surface, the conductive bump having a second width (for example, element 320) greater than the first width. The method includes attaching the conductive bump to the lead, wherein after the attaching step, a portion of the conductive bump extends to at least partially surround side surfaces of the lead. The method includes encapsulating (for example, element 40) the semiconductor chip, the conductive bump, and at least portions of the lead.

In another embodiment, the step of providing the lead frame can include providing a lead having one or more of: a concave portion on a side surface of lead (for example, element 321), a narrow neck portion (for example, element 271), or a dimple (for example, element 291) in an upper surface of the lead. In a further embodiment, providing the conductive bump can include providing a conductive pillar (for example, element 321) having a solder portion (for example, element 341, 342) on an end surface of the conductive pillar. In still further embodiment, the second width to first width ratio is greater than or equal to about 2.

In view of all of the above, it is evident that a novel structure and method of making the structure are disclosed. Included, among other features, is an electronic package having a lead configured for attaching to an electronic chip, such as a semiconductor chip, in a flip chip or chip attach arrangement. In one embodiment, the lead is narrower than the conductive bump used to attach the electronic chip to the lead. The lead is configured to facilitate a strengthened solder joint. In one embodiment, the lead is configured to facilitate the flow of solder partially around side surfaces of the lead. In one embodiment, the side surfaces are configured to increase the surface area for solder attachment. In one embodiment, side surfaces of the lead have concave shaped portions. In another embodiment, the solder layer completely surrounds a portion of the lead. In a further embodiment, the lead is configured to have a narrow neck portion for attaching the conductive bump to lead. The narrow neck portion can be configured to facilitate the flow of solder partially or completely around the lead. In a further embodiment, a dimple is placed in a major surface of the lead to increase the surface area for forming the solder joint.

The foregoing embodiments provide, among other things, a stronger joining force for the joint between each lead and the solder of the conductive bump, even if the width of each lead is reduced and the size of the conductive pillar of the conductive bump is increased upon fabricating the semiconductor package using smaller lead frames, such as micro lead frames. More particularly, even if the width of each lead is reduced and the size of the conductive bump is increased to cope with the fine pitch for each lead and the increase in size of the copper pillar of the conductive bump, soldering is performed such that the solder surrounds at least portions the lead, thus providing an improved joining force for the solder joint of the conductive bump relative to each lead.

While the subject matter of the invention is described with specific preferred embodiments and example embodiments, the foregoing drawings and descriptions thereof depict only typical embodiments of the subject matter, and are not therefore to be considered limiting of its scope. It is evident that many alternatives and variations will be apparent to those skilled in the art. For example, the configurations of neck portion 271 and dimple 291 are illustrative only and other patterns, shapes, and configurations are possible for providing desired bond strengthening. Also, molding compound resin 40 can be formed by overmolding and saw-through techniques, formed by cavity molding and punch techniques, or formed by other techniques as known to those of ordinary skill in the art.

As the claims hereinafter reflect, inventive aspects may lie in fewer than all features of a single foregoing disclosed embodiment. Thus, the hereinafter expressed claims are hereby expressly incorporated into this Detailed Description of the Drawings, with each claim standing on its own as a separate embodiment of the invention. Furthermore, while some embodiments described herein include some but not other features included in other embodiments, combinations of features of different embodiments are meant to be within the scope of the invention, and form different embodiments, as would be understood by those skilled in the art.

We claim:

1. A semiconductor package comprising:
   a plurality of leads, each lead having a bond finger;
   a semiconductor chip having a plurality of conductive bumps, each conductive bump including a conductive pillar and a solder portion, each conductive bump attached to one of the bond fingers; and
   a molding compound resin molded to seal the semiconductor chip, at least portions of the leads, and the conductive bump, wherein a width of the conductive pillar is larger than a width of each of the leads, and wherein the solder portion extends beyond an upper surface of the bond finger and at least partially surrounds a surface area of a portion of the bond finger.

2. The semiconductor package of claim 1, wherein the solder portion completely surrounds the surface area of the portion of the bond finger.

3. The semiconductor package of claim 1, wherein at least a portion of the surface area comprises a concave portion.

4. The semiconductor package of claim 1, wherein each bond finger has concave portions on opposing side surfaces in cross-sectional view.

5. The semiconductor package of claim 4 further comprising a dimple in a major surface of the bond finger, wherein the dimple is disposed between the concave portions.

6. The semiconductor package of claim 1, wherein a portion of the bond finger where the conductive bump is attached comprises a narrow neck, which has a width smaller than another width of the bond finger.

7. The semiconductor package of claim 1 further comprising a dimple in a major surface of the bond finger, at least a portion of the solder portion disposed within the dimple.

8. The semiconductor package of claim 7, wherein the dimple is in an upper major surface of the bond finger adjacent the semiconductor chip.

9. The semiconductor package of claim 1, wherein the semiconductor package has a bump-to-lead width ratio of about 2 or more.

10. The semiconductor package of claim 9, wherein the semiconductor package comprises a micro lead frame package.

11. An electronic package structure comprising:
a lead having a first width;
an electronic chip having a conductive bump on a major surface, wherein the conductive bump has a second width greater than the first width, and wherein the conductive bump is attached to the lead, wherein a portion of the conductive bump extends to at least partially surround a side surface of the lead; and
a molding compound resin sealing the electronic chip, the conductive bump, and at least a portion of the lead.

12. The structure of claim 11, wherein the lead further comprises a bond finger having the first width, wherein the conductive bump is attached to the bond finger.

13. The structure of claim 11, wherein side surfaces of the lead have concave portions.

14. The structure of claim 11 further comprising a dimple in a major surface of the lead, wherein a portion of the conductive bump is within the dimple.

15. The structure of claim 11, wherein the portion of the conductive bump completely surrounds a portion of the lead.

16. The structure of claim 11, wherein the conductive bump comprises a conductive pillar and a solder portion on a tip of the conductive pillar, wherein the solder portion extends to at least partially cover sides surfaces of the lead.

17. The structure of claim 11, wherein the lead further comprises a narrow neck portion, the narrow neck portion having the first width, and wherein the lead has a third width greater than the first width.

18. The structure of claim 11, wherein the second width to first width ratio is 2 or more.

19. A method for forming a semiconductor package comprising:
providing a lead frame having a lead, the lead having a first width;
providing a semiconductor chip having a conductive bump on a major surface, the conductive bump having a second width greater than the first width;
attaching the conductive bump to the lead, wherein after attaching the attaching step, a portion of the conductive bump extends to at least partially surround side surfaces of the lead; and
encapsulating the semiconductor chip, the conductive bump, and at least portions of the lead.

20. The method of claim 19, wherein:
providing the lead frame includes providing a lead having one or more of: a concave portion on a side surface of lead, a narrow neck portion, or a dimple in an upper surface of the lead;
providing the conductive bump comprises providing a conductive pillar having a solder portion on an end surface of the conductive pillar; and
the second width to first width ratio is greater than or equal to about 2.

* * * * *